US005315127A

United States Patent [19]

Nakanishi et al.

[11] Patent Number: 5,315,127

[45] Date of Patent: May 24, 1994

[54] SEMICONDUCTOR DEVICE FOR EMITTING HIGHLY SPIN-POLARIZED ELECTRON BEAM

[75] Inventors: Tsutmu Nakanishi, Nagoya; Hiromichi Horinaka, Suita; Takashi Saka, Nagoya; Toshihiro Kato, Kasugai, all of Japan

[73] Assignee: Daido Tokushuko Kabushiki Kaisha, Nagoya, Japan

[21] Appl. No.: 876,579

[22] Filed: Apr. 30, 1992

[30] Foreign Application Priority Data

| | | | |
|---|---|---|---|
| May 2, 1991 | [JP] | Japan | 3-130611 |
| Jun. 7, 1991 | [JP] | Japan | 3-163642 |
| Mar. 21, 1992 | [JP] | Japan | 4-094807 |

[51] Int. Cl.$^5$ .......... H01L 29/161

[52] U.S. Cl. .......... 257/11; 257/190; 257/184

[58] Field of Search .......... 257/18, 190, 201, 13, 257/10, 11, 439

[56] References Cited

U.S. PATENT DOCUMENTS

| | | | |
|---|---|---|---|
| 4,616,241 | 10/1986 | Biefeld et al. | 257/18 |
| 4,928,154 | 5/1990 | Umeno et al. | 257/18 |
| 5,048,036 | 9/1991 | Scifres et al. | 257/201 |
| 5,117,469 | 5/1992 | Cheung et al. | 257/18 |
| 5,132,746 | 4/1992 | Mendez et al. | 257/190 |
| 5,132,981 | 4/1992 | Uomi et al. | 257/18 |

*Primary Examiner*—Jerome Jackson
*Assistant Examiner*—John Guay
*Attorney, Agent, or Firm*—Oblon, Spivak, McClelland, Maier & Neustadt

[57] ABSTRACT

A semiconductor device for emitting, upon receiving a light energy, a highly spin-polarized electron beam, including a first compound semiconductor layer formed of gallium arsenide phosphide, $GaAs_{l-x}P_x$, and having a first lattice constant; a second compound semiconductor layer grown with gallium arsenide, GaAs, on the first compound semiconductor layer, and having a second lattice constant different from the first lattice constant, the second compound semiconductor layer emitting the highly spin-polarized electron beam upon receiving the light energy; and a fraction, x, of the gallium arsenide phosphide $GaAs_{l-x}P_x$ and a thickness, t, of the second compound semiconductor layer defining a magnitude of mismatch between the first and second lattice constants, such that the magnitude of mismatch provides a residual strain, $\epsilon_R$, of not less than $2.0\times10^{-3}$ in the second layer. The fraction x of the gallium arsenide phosphide $GaAs_{l-x}P_x$ and the thickness t of the second compound semiconductor layer may define the magnitude of mismatch between the first and second lattice constants, such that the magnitude of mismatch provides an energy splitting between a heavy hole band and a light hole band in the second layer so that the energy splitting is greater than a thermal noise energy in the second layer.

10 Claims, 11 Drawing Sheets

SEMICONDUCTOR DEVICE FOR EMITTING HIGHLY SPIN-POLARIZED ELECTRON BEAM

BACKGROUND OF THE INVENTION

1. Field of the Invention

The present invention relates to a semiconductor device for emitting, upon receiving a light energy, a highly spin-polarized electron beam.

2. Related Art Statement

Spin-polarized electron beam in which a large or major portion of the electrons have their spins aligned in one of the two spin directions, is used in the field of high-energy elementary-particle experiment, for investigating the magnetic structure of atomic nucleus or the magnetic structure of material's surface. For generating a spin-polarized electron beam, it is commonly practiced to apply a circularly polarized laser beam to the surface of a compound semiconductor crystal such as of gallium arsenide GaAs, so that the semiconductor crystal emits an electron beam in which the spin directions of the electrons are largely aligned in one of the two directions because of the selective transition due to the law of conservation of angular momentum.

However, it is theoretically estimated that the above-indicated conventional, spin-polarized electron beam emitting device would suffer from an upper limit, 50%, to polarization (degree of polarity) of the spin-polarized electron beam emitted therefrom, at which limit the ratio of the number of electrons having upspins to the number of electrons having downspins is 1 to 3, or 3 to 1. In addition, it is technically difficult to achieve the theoretical upper limit of 50% because of various sorts of restrictions, and accordingly only a polarization of about 40% at most is available. Thus, the conventional semiconductor device is not capable of producing a highly spin-polarized electron beam having a not less than 50% polarization.

Meanwhile, it is possible to provide a spin-polarized electron beam emitting device in which a semiconductor crystal has a stress in a certain direction so as to have a uniaxial anisotropy in the valence band thereof. However, it is difficult to cause the semiconductor crystal to have a sufficiently large strain or cause the crystal to have a strain in a stable manner. In addition, this device would suffer from the problem that an external means used for producing the stress or strain in the semiconductor crystal may interfere with extraction of the spin-polarized electron beam therefrom.

SUMMARY OF THE INVENTION

It is therefore an object of the present invention to provide a semiconductor device capable of emitting a highly spin-polarized electron beam.

It is another object of the invention to provide a semiconductor device capable of emitting a highly spin-polarized electron beam in a simple and stable manner.

The above objects have been achieved by the present invention. According to a first aspect of the present invention, there is provided a semiconductor device for emitting, upon receiving a light energy, a highly spin-polarized electron beam, comprising a first compound semiconductor layer having a first lattice constant, a second compound semiconductor layer having a second lattice constant different from the first lattice constant, and being in junction contact with the first compound semiconductor layer to provide a strained semiconductor heterostructure, the second compound semiconductor layer emitting the highly spin-polarized electron beam upon receiving the light energy, and a magnitude of mismatch between the first and second lattice constants defining an energy splitting between a heavy hole band and a light hole band in the second compound semiconductor layer, such that the energy splitting is greater than a thermal noise energy in the second compound semiconductor layer.

In the semiconductor device constructed as described above, the second compound semiconductor layer having the second lattice constant different from the first lattice constant of the first compound semiconductor layer, is in junction contact with the first layer, so as to provide a strained semiconductor heterostructure. Consequently, the lattice of the second layer is strained, and the valence band of the second layer comes to have a band splitting. More specifically, there is a subband of heavy holes (i.e., heavy hole band) and a subband of light holes (i.e., light hole band) in the valence band of the second layer and, if there is no strain in the lattice of the second layer, the energy levels of the two subbands are equal to each other at the lowest energy levels thereof. On the other hand, if there is a strain in the lattice of the second layer, an energy gap or splitting is produced between the energy levels of the two subbands. Meanwhile, the spin direction of the electrons excited from the heavy hole band is opposite to that of the electrons excited from the light hole band. Thus, if the second layer receives a light energy which excites only one of the heavy and light hole bands which band has the upper energy level, i.e., has the smaller energy gap with respect to the conduction band of the second layer, a number of electrons having their spins largely aligned in one of the two spin directions are excited in the second layer, so that a highly spin-polarized electron beam consisting of those electrons is emitted from the second layer. Furthermore, the strain of the lattice of the second layer is very stable since the strain is generated internally of the semiconductor device because of the heterostructure of the first and second layers whose lattice constants are different from each other. Thus, the highly spin-polarized electron beam emitted from the present semiconductor device, has a highly stable polarization, and is by no means interfered with by an external means for producing a strain in the lattice of the second layer.

Meanwhile, if the energy splitting between the heavy and light hole bands is excessively small, electrons are excited from both the two bands because of thermal noise energy in the second layer, so that the electron beam emitted suffers from an insufficiently low polarization. On the other hand, in the present semiconductor device, the magnitude of mismatch between the first and second lattice constants of the first and second layers is determined to define an energy gap or splitting between the heavy and light hole bands such that the energy splitting is greater than the thermal noise energy in the second layer. Therefore, the excitation of electrons from one of the two bands which band has the lower energy level, is effectively prevented, so that the semiconductor device emits a highly spin-polarized electron beam having a sufficiently high polarization.

According to a second aspect of the present invention, there is provided a semiconductor device for emitting, upon receiving a light energy, a highly spin-polarized electron beam, comprising a first compound semiconductor layer formed of gallium arsenide phosphide, $GaAs_{1-x}P_x$, and having a first lattice constant, a second compound semiconductor layer grown with gallium arsenide, GaAs, on the first compound semiconductor layer, and having a second lattice constant different from the first lattice constant, the second compound semiconductor layer emitting the highly spin-polarized electron beam upon receiving the light energy, and a fraction, x, of the gallium arsenide phosphide $GaAs_{1-x}P_x$ and a thickness, t, of the second compound semiconductor layer defining a magnitude of mismatch between the first and second lattice constants, such that the magnitude of mismatch provides a residual strain, $\epsilon_R$, of not less than $2.0\times10^{-3}$ in the second compound semiconductor layer.

In the semiconductor device according to the second aspect of the invention, the fraction x of the gallium arsenide phosphide $GaAs_{1-x}P_x$ of the first layer and the thickness t of the gallium arsenide GaAs of the second layer are determined to define the magnitude of mismatch between the first and second lattice constants of the first and second layers, such that the magnitude of mismatch provides a residual strain, $\epsilon_R$, of not less than $2.0\times10^{-3}$ in the second layer. Thus, the energy splitting (magnitude of energy splitting), ΔE, produced due to the degeneracy in the valence band of the GaAs layer, is to be not less than 13 meV. Therefore, the electron beam emitted from the present semiconductor device enjoys a not less than 50% spin polarization.

In a preferred embodiment of the semiconductor device according to the second aspect of the invention, the fraction x of the gallium arsenide phosphide $GaAs_{1-x}P_x$ and the thickness t, in angstrom unit, of the second compound semiconductor layer satisfy the following two approximate expressions:

$$t \leqq -18000x+8400$$

$$t \leqq -7000x+5100$$

In another embodiment of the semiconductor device according to the second aspect of the invention, the fraction x and the thickness t define the magnitude of mismatch between the first and second lattice constants such that the magnitude of mismatch provides the residual strain $\epsilon_R$ of not less than $2.6\times10^{-3}$ in the second compound semiconductor layer, the fraction x and the thickness t in angstrom unit satisfying the following two expressions:

$$t \leqq -12000x+6400$$

$$t \leqq -6000x+4600$$

In this case, the energy splitting ΔE in the valence band of the GaAs layer is not less than 17 meV. Thus, the electron beam emitted from the semiconductor device has a not less than 60% spin polarization.

In yet another embodiment of the semiconductor device according to the second aspect of the invention, the fraction x and the thickness t define the magnitude of mismatch between the first and second lattice constants such that the magnitude of mismatch provides the residual strain $\epsilon_R$ of not less than $3.5\times10^{-3}$ in the second compound semiconductor layer, the fraction x and the thickness t in angstrom unit satisfying the following two expressions:

$$t \leqq -10000x+5600$$

$$t \leqq -6000x+4400$$

In this case, the energy splitting ΔE in the valence the GaAs layer is not less than 23 meV. Thus, the electron beam emitted from the semiconductor device has a not less than 70% spin polarization.

In a further embodiment of the semiconductor device according to the second aspect of the invention, the fraction x and the thickness t define the magnitude of mismatch between the first and second lattice constants such that the magnitude of mismatch provides the residual strain $\epsilon_R$ of not less than $4.6\times10^{-3}$ in the second compound semiconductor layer, the fraction x and the thickness t in angstrom unit satisfying the following expression:

$$t \leqq -4000x+3400$$

In this case, the energy splitting ΔE in the valence band of the GaAs layer is not less than 30 meV. Therefore, the electron beam emitted from the semiconductor device has a not less than 80% spin polarization.

In a still further embodiment of the semiconductor device according to the second aspect of the invention, the fraction x and the thickness t define the magnitude of mismatch between the first and second lattice constants such that the magnitude of mismatch provides the residual strain $\epsilon_R$ of not less than $5.4\times10^{-3}$ in the second compound semiconductor layer, the fraction x and the thickness t in angstrom unit satisfying the following two expressions:

$$t \leqq -3000x+2800$$

$$t \leqq 22000x-2200$$

In this case, the energy splitting ΔE in the valence band of the GaAs layer is not less than 35 meV. Therefore, the electron beam emitted from the semiconductor device has a not less than 85% spin polarization.

In an advantageous embodiment of the semiconductor device according to the second aspect of the invention, the fraction x of the gallium arsenide phosphide $GaAs_{1-x}P_x$ and the thickness t of the second compound semiconductor layer define the magnitude of mismatch between the first and second lattice constants, such that the magnitude of mismatch provides an energy splitting between a heavy hole band and a light hole band in the second layer so that the energy splitting is greater than a thermal noise energy in the second layer.

BRIEF DESCRIPTION OF THE DRAWINGS

The above and optional objects, features and advantages of the present invention will be better understood by reading the following detailed description of the presently preferred embodiments of the invention when considered in conjunction with the accompanying drawings, in which.

DETAILED DESCRIPTION OF THE PREFERRED EMBODIMENTS

Figure 1:
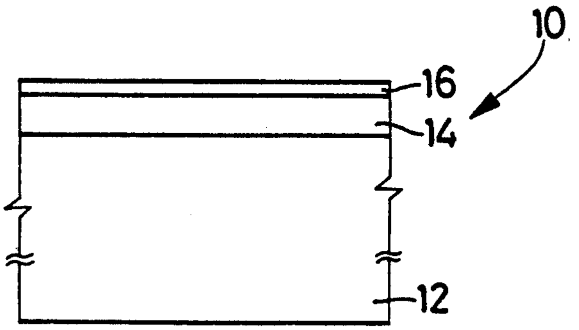
FIG. 1 is a view for illustrating the muti-layer structure of a spin-polarized electron beam emitting device embodying the present invention.

Referring first to FIG. 1, there is shown a spin-polarized electron beam emitting device 10 in accordance with the present invention. The device 10 includes a gallium arsenide (GaAs) semiconductor crystal substrate 12. On the GaAs substrate, a crystal of gallium arsenide phosphide ($GaAs_{1-x}P_x$), and subsequently a crystal of gallium arsenide (GaAs), are grown by a well-known MOCVD (metal organic chemical vapor deposition) method, to provide a first and second compound semiconductor layer 14, 16, respectively. The GaAs substrate 12 has a thickness of about 350 μm. Impurities such as zinc (Zn) are doped into the GaAs substrate 12, so as to provide a p-type GaAs semiconductor monocrystalline substrate (p-GaAs) having a carrier concentration of about $5\times10^{18}$ ($cm^{-3}$). The GaAs substrate 12 has a (100) plane face. The $GaAs_{1-x}P_x$ layer 14 grown on the GaAs substrate 12 has a thickness of about 2.0 μm. Impurities such as zinc are doped into the $GaAs_{1-x}P_x$ layer 14, so as to provide a p-type $GaAs_{1-x}P_x$ semiconductor monocrystalline layer (p-$GaAs_{1-x}P_x$) having a carrier concentration of about $5\times10^{18}$ ($cm^{-3}$). The GaAs layer 16 has a predetermined thickness, t. Impurities such as zinc are doped into the GaAs layer 16, so as to provide a p-type GaAs semiconductor monocrystalline layer (p-GaAs) having a carrier concentration of about $5\times10^{18}$ ($cm^{-3}$). The GaAs layer (second compound semiconductor layer) 16 has no oxidation treatment film or the like on the surface thereof.

A fraction, x, of the $GaAs_{1-x}P_x$ layer (first compound semiconductor layer) 14 and a thickness, t, of the GaAs layer 16 are determined so as to provide a residual strain, $\epsilon_R$, of not less than $2.0\times10^{-3}$ in the GaAs layer 16. More specifically, the fraction x and the thickness t in angstrom unit take respective values which satisfy the following two approximate expressions (1) and (2):

$$t \leqq -18000x+8400 \quad (1)$$

$$t \leqq -7000x+5100 \quad (2)$$

The actual thickness t of the GaAs layer 16 exceeds a critical thickness, $t_c$, for the coherent growth thereof. However, since the GaAs layer 16 has a lattice constant different from that of the $GaAs_{1-x}P_x$ layer 14, the GaAs layer 16 cooperates with the $GaAs_{1-x}P_x$ layer 14 with which the GaAs layer 16 is in junction contact, to provide a strained semiconductor heterostructure in which the GaAs layer 16 has a strain in the lattice thereof. Because of the strained lattice of the GaAs layer 16, an energy splitting, ΔE, is produced due to the degeneracy between the energy level of a subband of heavy hole (heavy hole band) and the energy level of a subband of light hole (light hole band) in the valence band of the GaAs layer 16.

The critical thickness $t_c$ indicates an upper limit under which a magnitude of mismatch between the lattices of the two layers 14, 16 would be accommodated only by an elastic strain produced in the GaAs layer 16. The critical thickness $t_c$ is defined by the following expression (3):

$$t_c = \frac{b}{4\pi f}\cdot\frac{(1-\nu/4)}{(1-\nu)}\left(\ln\frac{t_c}{b}+1\right) \quad (3)$$

wherein b: magnitude of Burgers vector,

γ: Poisson's ratio, and f: a ratio of the magnitude of mismatch between the lattice constants of the two layers 14, 16 with respect to the latice constant of the $GaAs_{1-x}P_x$ 14.

Concerning an example in which b=4 angstroms (Å), γ=0.31, and f=0.006, a critical thickness $t_c$ is about 200 angstroms.

Figure 2:
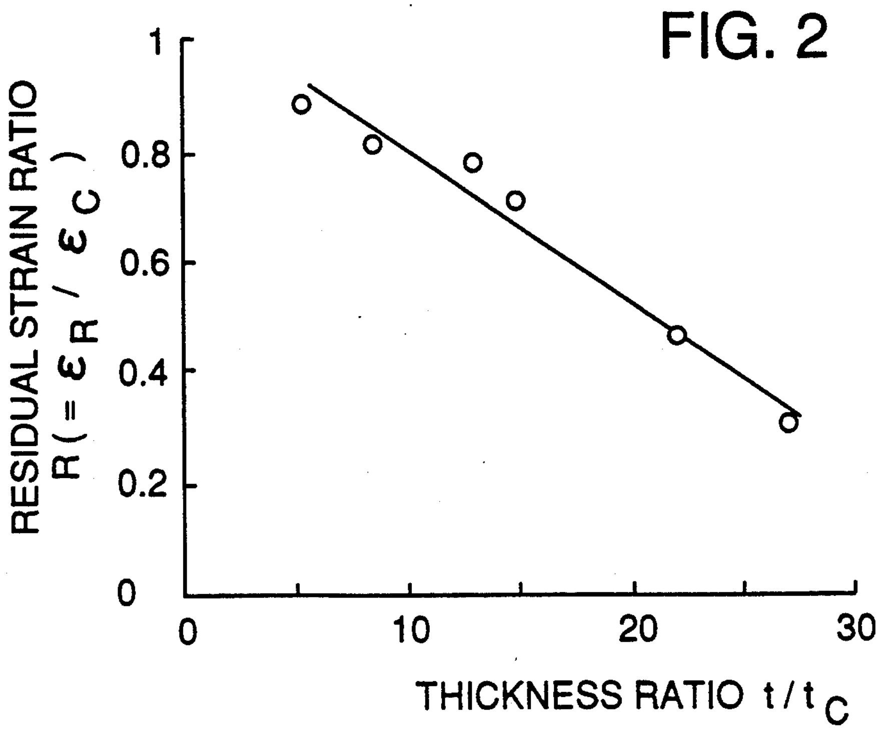
FIG. 2 is a graph representing a relationship between a ratio, $t/t_c$, of an actual thickness, t, of a GaAs layer of the device of FIG. 1 to a critical thickness, $t_c$, thereof, and a residual strain ratio, R, of the GaAs layer.

The above-indicated parameter f is defined by the fraction x of the $GaAs_{1-x}P_x$ crystal of the first layer 14. Meanwhile, experiments conducted by the Inventors have elucidated that the relationship between a ratio, $t/t_c$, of the actual thickness t of the GaAs layer 16 to the critical thickness $t_c$, and a residual strain ratio, R, of the GaAs layer 16 is linear as shown in FIG. 2. The residual strain ratio R is a ratio of an actual residual strain, $\epsilon_R$, in the GaAs layer 16 to a strain, $\epsilon_R$, of a reference GaAs layer which is assumed to be grown coherently.

In addition, the relationship between the energy splitting ΔE of the valence band of the GaAs layer 16, and the actual residual strain $\epsilon_R$ of the GaAs layer 16, is generally defined by the following expression (4):

$$\Delta E=6.5\epsilon_R \text{ (eV)} \quad (4)$$

Figure 3:
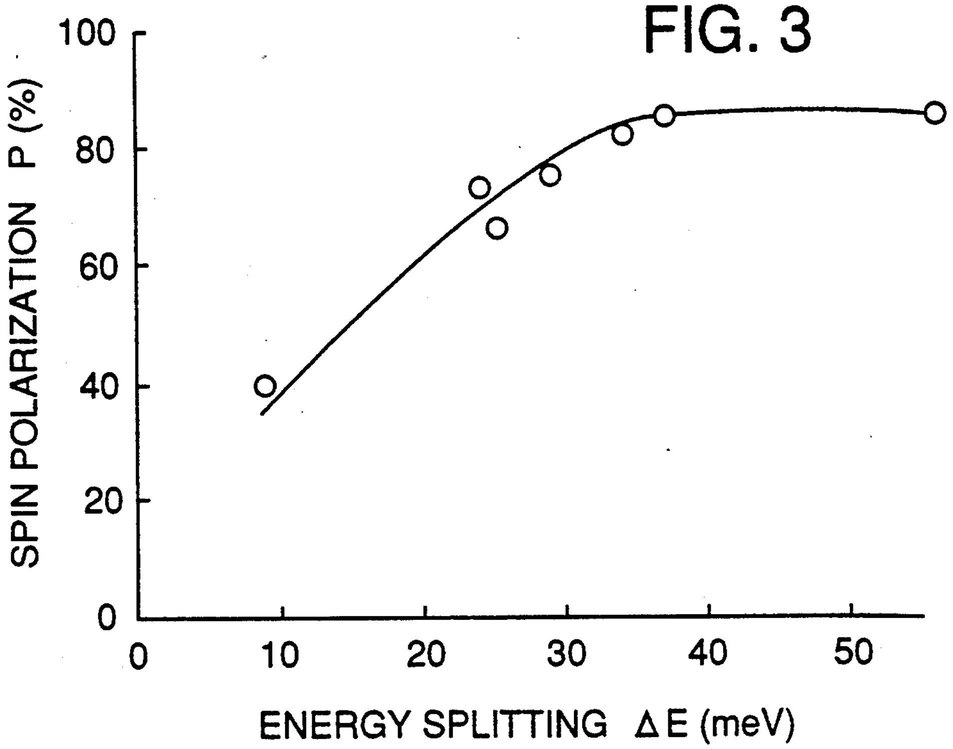
FIG. 3 is a graph representing a relationship between an energy splitting, ΔE, of the valence band of the GaAs layer of the device of FIG. 1, and a spin polarization, P, of an electron beam emitted from the device.

Meanwhile, experiments conducted by the Inventor have shown, as indicated in FIG. 3, that the relationship between the energy splitting ΔE of the valence band of the GaAs layer 16, and the spin polarization P of the electron beam emitted from the semiconductor device 10, is linear under the level of about 35 meV of the energy splitting ΔE, and that the energy splitting ΔE is saturated after the level of 35 meV.

Figure 4:
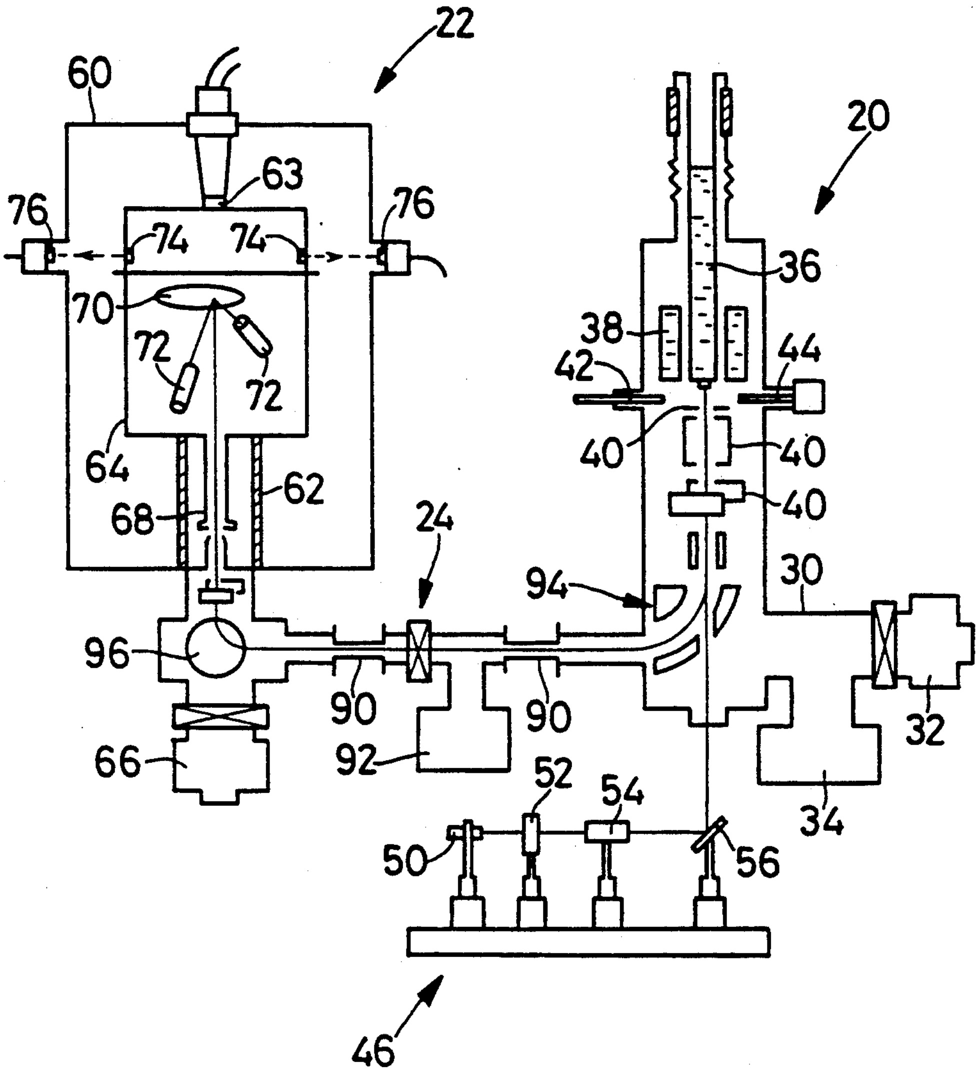
FIG. 4 is a view of an apparatus for measuring a spin polarization P of an electron beam emitted from the device of FIG. 1.

The above-indicated spin polarization P is measured by, for example, an apparatus shown in FIG. 4. The semiconductor device 10 is disposed in a gun assembly 20 for producing a spin-polarized electron beam. The apparatus further includes, in addition to the gun assembly 20, a polarization analyzer 22 for measuring a polarization (degree of polarity) of the electron beam emitted from the electron gun 20, and a transmission assembly 24 for transmitting the electron beam emitted from the gun 20, to the polarization analyzer 22.

The gun assembly 20 includes a vacuum housing 30 for providing a high vacuum chamber, a turbo-molecular pump 32 and an ion pump 34 for sucking gas from the vacuum housing 30 and thereby placing the housing 30 under a high vacuum of about $10^{-9}$ torr, a first container 36 for holding the semiconductor device 10 in the vacuum housing 30 and accommodating liquid nitrogen for cooling the device 10, and a second container 38 surrounding the first container 36, for accommodating liquid nitrogen for condensing residual gas in the housing 30, on the surface thereof. The gun assembly 20 further includes a plurality of extraction electrodes 40 for extracting electrons from the surface of the semiconductor device 10, a cesium (Cs) activator 42 and an oxygen ($O_2$) activator 44 for emitting cesium and oxygen toward the surface of the device 10, respectively, and a laser beam generator 46 for applying a laser beam to the surface of the device 10. The laser beam generator 46 includes a tunable laser beam source 50 for generating a laser beam having a selected wavelength of 700 to 900 nm, and a polarizer 52 for transmitting only a linearly polarized light therethrough, a quarter wavelength element 54 for converting a linearly polarized light to a circularly polarized light, and a mirror 56 for directing the circularly polarized light toward the surface of the semiconductor device 10.

The polarization analyzer 22 includes a high-voltage tank (Mott's scattering tank) 64 which is disposed in a gas tank 60 filled with Freon and is supported by a high-voltage insulator 62, and to which a 100 kV electric voltage is applied through an anode 63. The analyzer 22 further includes a turbo-molecular pump 66 for sucking gas from the high-voltage tank 64 and thereby placing the tank 64 under a high vacuum of about $10^{-6}$ torr, an accelerator electrode 68 for accelerating the spin-polarized electron beam, a gold (Au) foil 70 which is supported by a disk (not shown) and to which the spin-polarized electron beam is incident, a pair of surface barrier detectors 72 for detecting electrons scattered in the direction of $\Theta = 120°$ as a result of collision of the electron beam with atomic nuclei of the Au foil 70, a pair of light emitting diodes (LED) 74 each for converting, to a light, an electric signal generated by a corresponding one of the surface barrier detectors 72 and subsequently amplified by a corresponding one of two pre-amplifiers 84 (FIG. 5), and a pair of light detectors 76 each for receiving the light emitted by a corresponding one of the LEDs 74 and converting the light into an electric signal.

Figure 5:
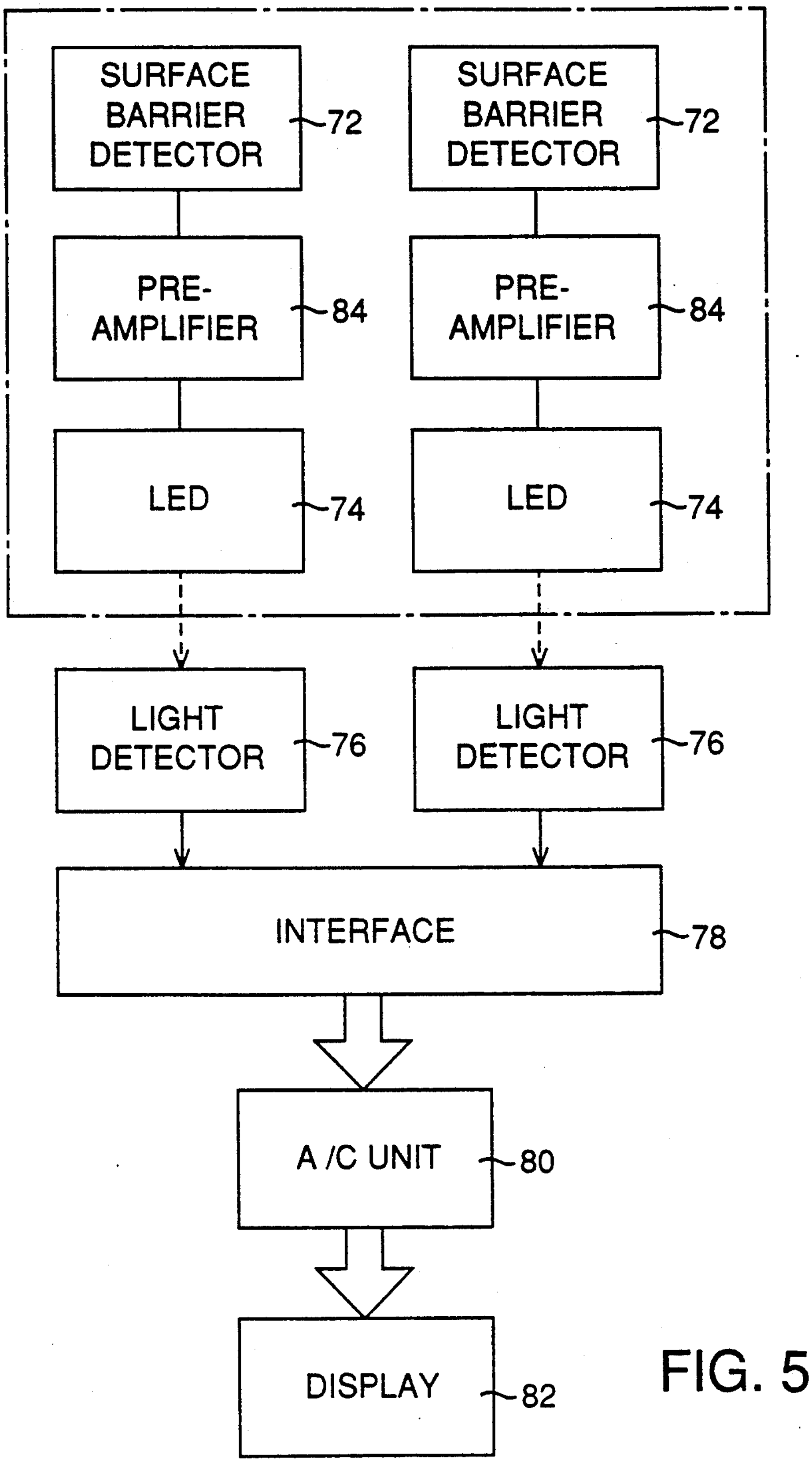
FIG. 5 is a diagrammatic view of the electric configuration of the apparatus of FIG. 4.

FIG. 5 shows an electric circuit for determining a spin polarization of the electron beam emitted from the gun assembly 22 or semiconductor device 10, based on the electric signals supplied through the two channels from the two surface barrier detectors 72. In the figure, an electric signal from each of the surface barrier detectors 72 is amplified by the corresponding pre-amplifier 84 and subsequently is converted by the corresponding LED 74 into a light signal, which signal in turn is converted by the corresponding light detector 76 into an electric signal. This electric signal is supplied to an arithmetic and control (A/C) unit 80 via an interface 78. The A/C unit 80 calculates a polarization of the electron beam incident to the Au foil 70, based on the supplied signals, according to pre-stored arithmetic expressions or software programs, and commands a display 82 to indicate the calculated polarization value.

Back to FIG. 4, the transmission assembly 24 includes a pair of conductance reducing tubes 90 disposed midway in a duct passage connecting between the vacuum housing 30 and the high-voltage tank 64, an ion pump 92 disposed at a position between the pair of tubes 90, and a spherical condenser 94 for electrostatically bending the electron beam extracted from the semiconductor device 10, by a right angle toward the high-voltage tank 64. The transmission assembly 24 further includes a Helmholtz coil 96 for magnetically bending the electron beam by a right angle toward the high-voltage tank 64. In the case where the vacuum housing 30 and the high-voltage tank 64 have a relative positional relationship which does not require bending of the electron beam, it is not necessary to employ the spherical condenser 94 or the Helmholtz coil 96.

As described above, the semiconductor device 10 used in the apparatus of FIG. 4 has no oxidation treatment film on the surface of the GaAs layer 16. Therefore, from the time immediately after the GaAs layer 16 is grown on the $GaAs_{l-x}P_x$ layer 14, it is required that the semiconductor device 10 be kept in a vacuum desiccator. First, this semiconductor device 10 is fixed to the lower end of the first container 36, and subsequently the vacuum housing 30 is brought into a high vacuum of about $10^{-9}$ torr and then is heated at about 420° C. for about fifteen minutes by a heater (not shown). Thus, the surface of the semiconductor device 10 is cleaned. Next, the cesium activator 42 and the oxygen activator 44 are operated for alternately emitting cesium and oxygen toward the surface of the semiconductor device 10, so that a small amount of cesium and oxygen is deposited to the device 10. Thus, the surface of the device 10 is made negative with respect to electron affinity (generally referred to as the "NEA"). The NEA means that the energy level of an electron in the bottom of the conduction band at the surface of the GaAs layer 16 is apparently higher than the energy level of an electron in vacuum. Third, at room temperature, i.e., without cooling the device 10 by the liquid nitrogen, the laser generator 46 is operated for emitting a circularly polarized laser beam toward the device 10. Upon injection of the laser beam into the device 10, the device 10 emits a number of electrons whose spins are largely aligned in one direction, and which are extracted as a highly spin-polarized electron beam by the extraction electrodes 40. This electron beam is transmitted by the transmission assembly 24, so as to be incident to the Au foil 70 of the high-voltage tank 64. Then, a spin polarization of the electron beam is measured by the electric circuit shown in FIG. 5.

Figure 6:
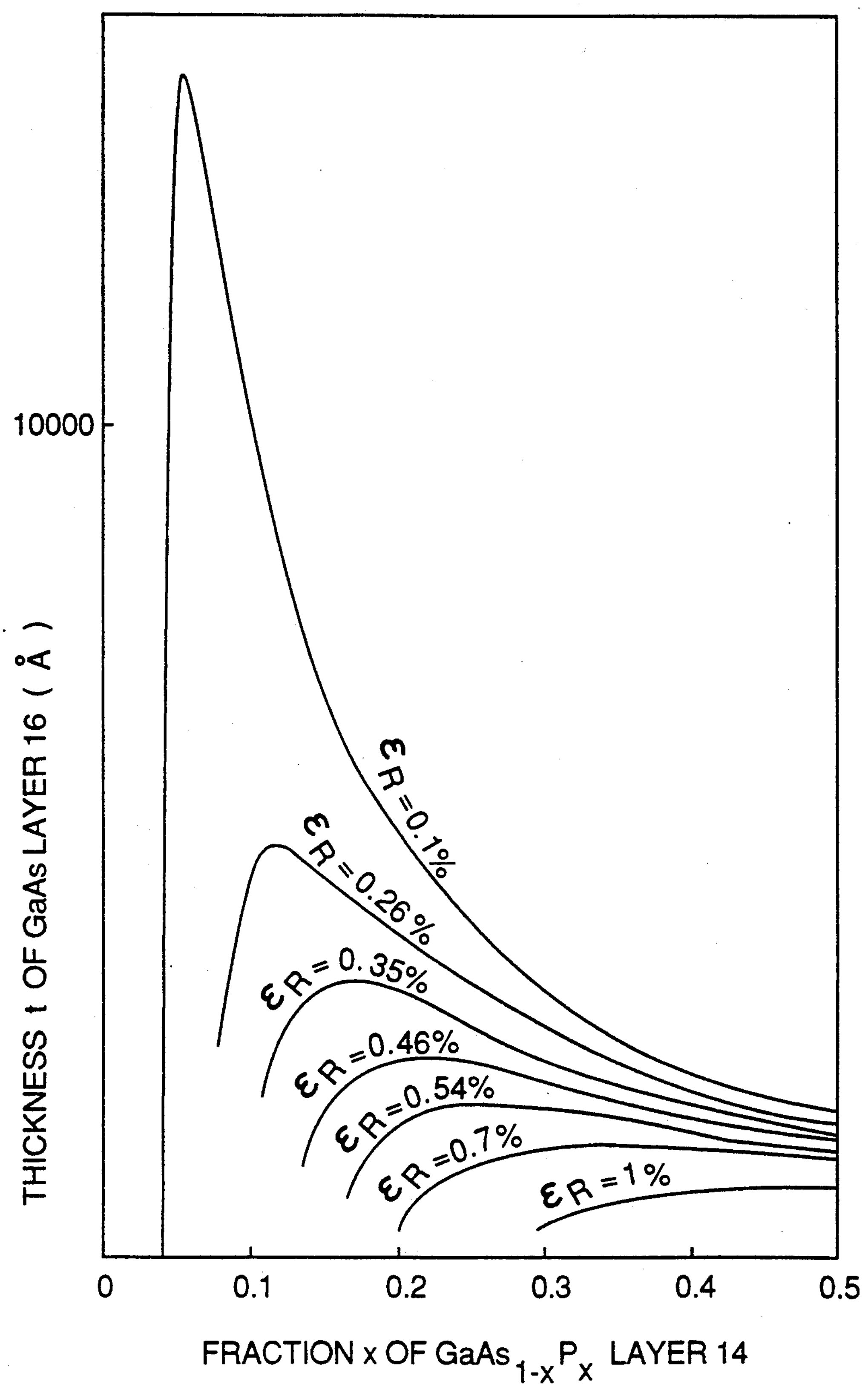
FIG. 6 is a graph representing the relationship between a fraction, x, of gallium arsenide phosphide, $GaAs_{1-x}P_x$, as another layer of the device of FIG. 1, and the thickness t of the GaAs layer of the device, as a residual strain, $\epsilon_R$, in the GaAs layer is varied as a parameter.

The coherent strain $\epsilon_c$ of the GaAs layer 16 is known in the art. Therefore, if the actual thickness t of the GaAs layer 16 and the fraction x of the $GaAs_{l-x}P_x$ layer 14 are given, a residual strain $\epsilon_R$ of the GaAs layer 16 can be determined according to the relationship shown in FIG. 2. FIG. 6 shows relationships between these three variables, x, t and $\epsilon_R$. More specifically, various curves shown in the graph of FIG. 6 represent corresponding relationships between the fraction x and the thickness t, as the residual strain $\epsilon_R$ is varied as a parameter. Since the energy splitting ΔE due to the degeneracy in the valence band of the GaAs layer 16 is defined by the residual strain $\epsilon_R$ according to the above-indicated expression (4), the relationship between the polarization P of the electron beam and the residual strain $\epsilon_R$, and the relationship between the polarization P and the fraction x or thickness t, are determined based on the curve shown in FIG. 3. Table I indicates respective values of the energy splitting ΔE, the residual strain $\epsilon_R$, and the fraction x and thickness t, when the polarization P takes 50%, 60%, 70%, 80% and 85%.

TABLE I

| P | ΔE | $\epsilon_R$ | Conditional Expressions of x and t (t in angstrom unit) |
|---|---|---|---|
| ≧50% | ≧13 | $\geqq 2.0 \times 10^{-3}$ | t ≦ −18000x + 8400<br>t ≦ −7000x + 5100 |
| ≧60% | ≧17 | $\geqq 2.6 \times 10^{-3}$ | t ≦ −12000x + 6400<br>t ≦ −6000x + 4600 |
| ≧70% | ≧23 | $\geqq 3.5 \times 10^{-3}$ | t ≦ −10000x + 5600<br>t ≦ −6000x + 4400 |
| ≧80% | ≧30 | $\geqq 4.6 \times 10^{-3}$ | t ≦ −4000x + 3400 |
| ≧85% | ≧35 | $\geqq 5.4 \times 10^{-3}$ | t ≦ −3000x + 2800<br>t ≦ −22000x − 2200 |

It emerges from the foregoing that, in order to obtain, for example, a not less than 50% polarization of an electron beam emitted from the semiconductor device 10, the fraction x and thickness t are selected at respective values each positioned on or under a curve (not shown in FIG. 6) representing a relationship between the variables x, t in the case where the residual strain $\epsilon_R$ is 0.2%. In order to obtain a not less than 60% polarization, the fraction x and thickness t are selected at respective values each on or under the curve, shown in FIG. 6, representing the relationship between the variables x, t in the case where the residual strain $\epsilon_R$ is 0.26%. In order to obtain a not less than 70% polarization, the fraction x and thickness t are selected at respective values each on or under the curve of the x, t relationship in the case where the residual strain $\epsilon_R$ is 0.35%. In order to obtain a not less than 80% polarization, the fraction x and thickness t are selected at respective values each on or under the curve of the x, t relationship in the case where the residual strain $\epsilon_R$ is 0.46%. In order to obtain a not less than 85% polarization, the fraction x and thickness t are selected at respective values each on or under the curve of the x, t relationship in the case where the residual strain $\epsilon_R$ is 0.54%.

The conditional expressions for the fraction x and thickness t, indicated in the TABLE I, represent respective areas each of which approximates a corresponding one of the actual areas defined by (or located on or under) the respective curves shown in FIG. 6. For example, concerning the conditional expressions, $t \leqq -12000x+6400$ and $t \leqq -6000x+4600$, for obtaining a not less than 60% polarization, the two equations, $t=-12000x+6400$ and $t=-6000x+4600$, represent two straight lines which cooperate with each other to approximate the curve representative of the x, t relationship, shown in FIG. 6, for the case where the residual strain $\epsilon_R$ is 0.26%. Therefore, in this case, for practical purposes, the fraction x and thickness t are selected at respective values each on or under the straight lines defined by the two equations.

Thus, in the semiconductor device 10 in accordance with the present invention, the fraction x of the gallium arsenide phosphide mixed-crystal $GaAs_{1-x}P_x$ of the first semiconductor layer 14 and the thickness t of the gallium arsenide crystal GaAs of the second semiconductor layer 16 are selected to define a difference, i.e., magnitude of mismatch, between the lattice constants of the two semiconductor crystals, such that the magnitude of mismatch provides a residual strain, $\epsilon_R$, of not less than $2.0 \times 10^{-3}$ in the second semiconductor layer 16. As described above, for practical purposes, the fraction x and thickness t are determined to satisfy the above-indicated approximations (1) and (2). Therefore, the energy splitting ΔE due to the degeneracy in the valence band of the GaAs layer 16 is to be not less than 13 meV, so that an electron beam emitted from the device 10 has a not less than 50% polarization.

While the illustrated semiconductor device 10 is produced by superposing, on the GaAs substrate 12, the $GaAs_{1-x}P_x$ layer (first layer) 14 and the GaAs layer (second layer) 16, it is possible to use, in place of the gallium arsenide GaAs, other sorts of materials for a substrate 12. In addition, it is possible to interpose another semiconductor layer between the substrate 12 and the first layer 14. In the latter case, those three semiconductor layers may be formed to have different constants, so that the three layers cooperate with each other to provide a semiconductor heterostructure.

In the illustrated semiconductor device 10, the fraction x of the $GaAs_{1-x}P_x$ of the first layer 14 and the thickness t of the gallium arsenide GaAs of the second layer 16 are determined to define magnitude of mismatch between the lattice constants of the two layers, such that the magnitude of mismatch provides a residual strain, $\epsilon_R$, of not less than $2.0 \times 10^{-3}$ in the second layer 16. However, it is preferred that the fraction x and the thickness t be determined to provide, in the second layer 16, a residual strain, $\epsilon_R$, of not less than $2.6 \times 10^{-3}$, more preferably not less than $3.5 \times 10^{-3}$, still more preferably not less than $4.6 \times 10^{-3}$, and most preferably not less than $5.4 \times 10^{-3}$.

EXAMPLE 1

The semiconductor device of FIG. 1 is manufactured such that the fraction x of the $GaAs_{1-x}P_x$ of the first layer 14 and the thickness t of the gallium arsenide GaAs of the second layer 16 are 0.17 ($GaAs_{0.83}P_{0.17}$) and about 850 angstroms (Å), respectively. In this example, the lattice constants of the first and second layers 14, 16 differ from each other by about 0.6%. Therefore, the second layer 16 cooperates with the first layer 14 with which the second layer 16 is held in junction constant, to provide a semiconductor heterostructure such that the lattice of the GaAs crystal of the second layer 16 has a strain. Because the strained GaAs crystal lattice, an energy gap or splitting ΔE is produced between the energy levels of the heavy and light hole bands (subbands) in the valence band of the second layer 16. This energy splitting ΔE is greater than a thermal noise energy, $E_o$, generated when the semiconductor device 10 is being used. The thermal noise energy $E_o$ is defined by the following expression:

$$E_o = kT$$

wherein k: Boltzmann's constant, and

T: absolute temperature

In the present example, the energy splitting ΔE is about 40 meV, which value is sufficiently greater than the thermal noise energy of about 26 meV at room temperature (25° C.). Since the critical thickness $t_c$ of the second layer 16 of the device 10 of FIG. 1 is about 200 angstroms as described previously, the actual thickness, 850 angstroms, of the second layer 16 is about four times greater than the critical thickness $t_c$.

Figure 7:
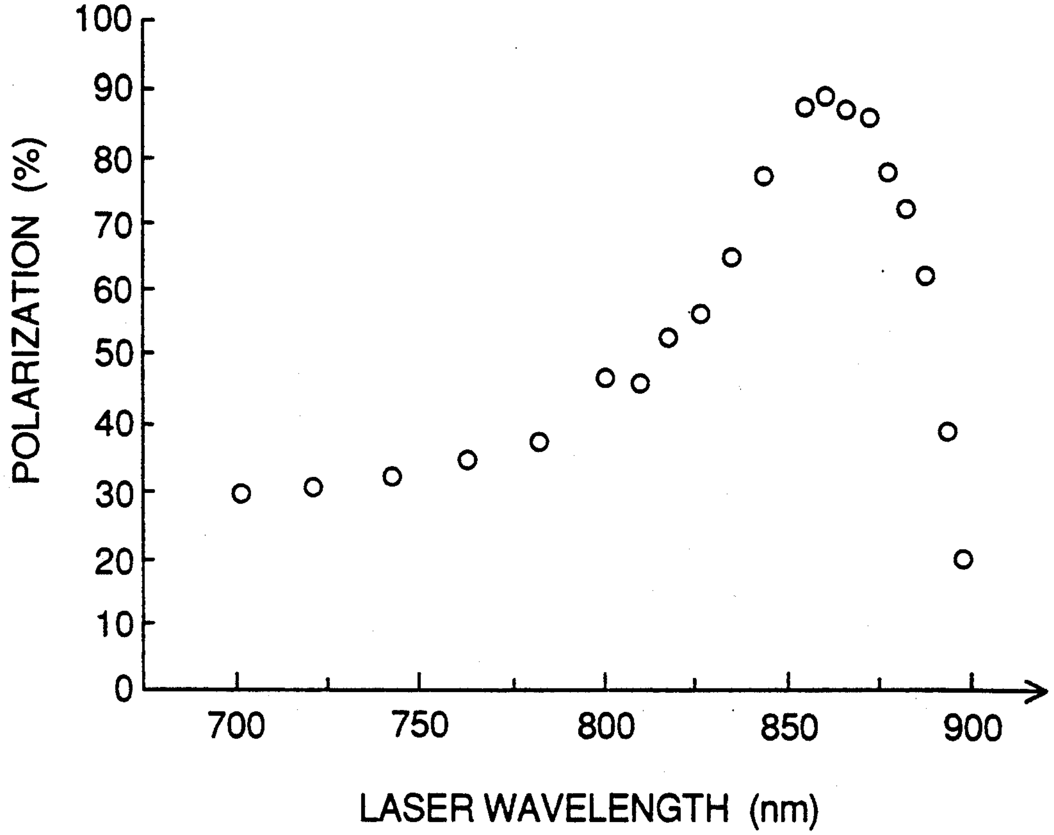
FIG. 7 is a graph representing the spin polarization values measured by the apparatus of FIG. 4.
Figure 8:
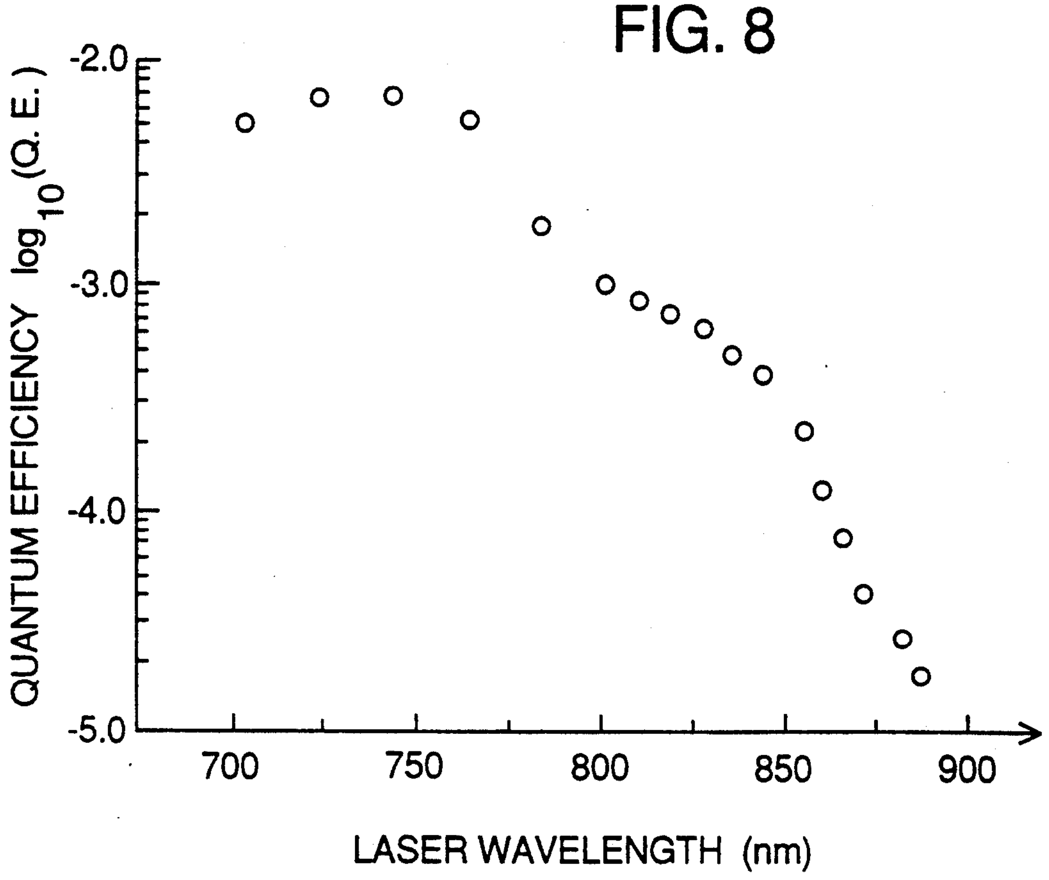
FIG. 8 is a graph representing the quantum efficiency (Q.E.) values measured when electron beams are emitted from the device of FIG. 1 incorporated by the apparatus of FIG. 4.

Experiments which the Inventors have conducted have shown that the spin polarization of an electron beam emitted from a conventional device (i.e., device manufactured by growing a p-GaAs layer on a p-GaAs substrate, that is, device equivalent to a device which would be obtained by removing the first layer 14 from the present device 10), is about 43%. On the other hand, the spin polarization of an electron beam emitted from the present device 10 (Example 1) is about 86% at the excitation laser wavelengths of 855 to 870 nm, as shown in FIG. 7. The present device 10 is observed with quantum efficiency (Q.E.) of about $2\times10^{-4}$ at the laser wavelengths of 855 to 870 nm, as shown in FIG. 8.

As is apparent from the foregoing, in the present device 10, the first and second layers 14, 16 cooperate with each other to provide a semiconductor heterostructure, so that the lattice of the second layer 16 is strained. Consequently, an energy splitting ΔE is produced between the energy levels of the heavy and light hole bands in the valence band of the second layer 16. Therefore, if a light energy which excites only an electron from one of the two bands which has the upper energy level (in the present example, the heavy hole band) is injected into the second layer 16, that is, if a photon with a 855 to 870 nm wavelength is injected into the second layer 16, a number of electrons whose spins are aligned in one of the two spin directions are emitted from the second layer 16 or device 10. Although the thickness t of the second layer 16 is greater than the critical thickness $t_c$, the magnitude of mismatch between the lattice constants of the first and second layer crystals 14, 16 is sufficiently large. Therefore, the second layer crystal 16 is to have a great strain, so that the energy splitting ΔE between the heavy and light hole bands is greater than the thermal noise energy and that the excitation of an electron from the light hole band is effectively controlled or prevented. As a result, the present device 10 enjoys an excellent spin polarization of 86%.

EXAMPLE 2

Figure 9:
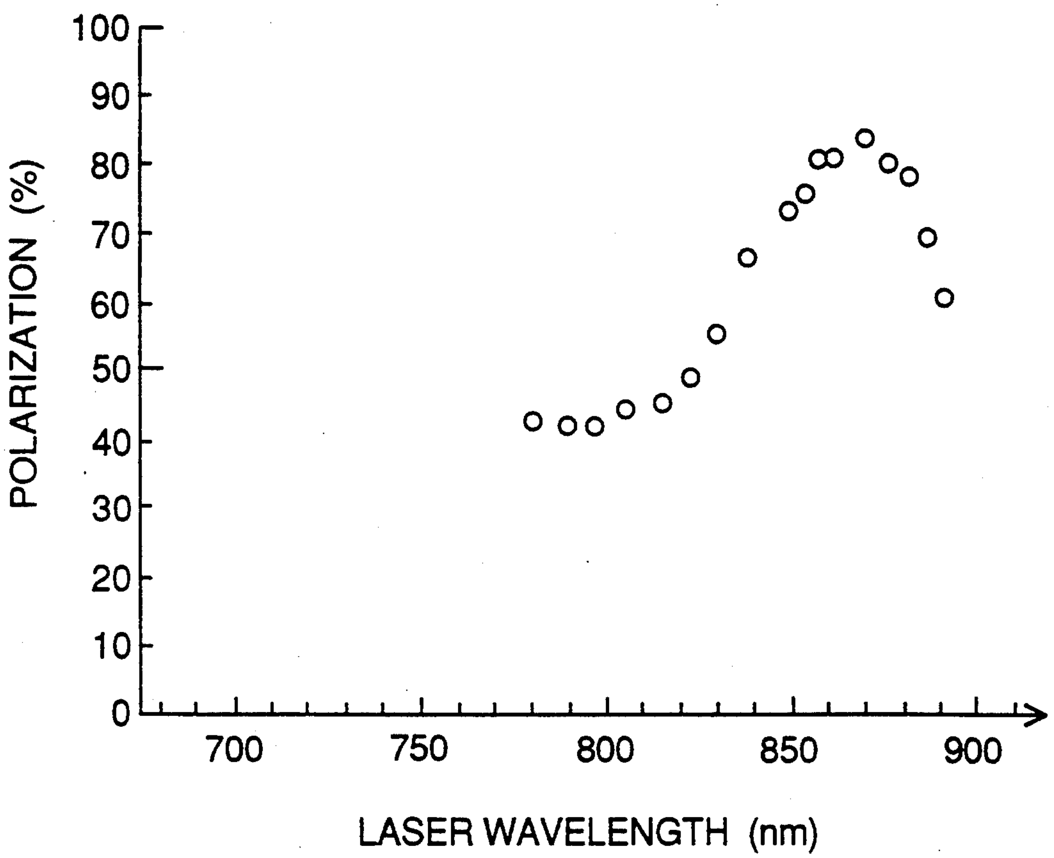
FIG. 9 is a graph representing the spin polarization values measured with respect to another spin-polarized electron beam emitting device embodying the present invention.
Figure 10:
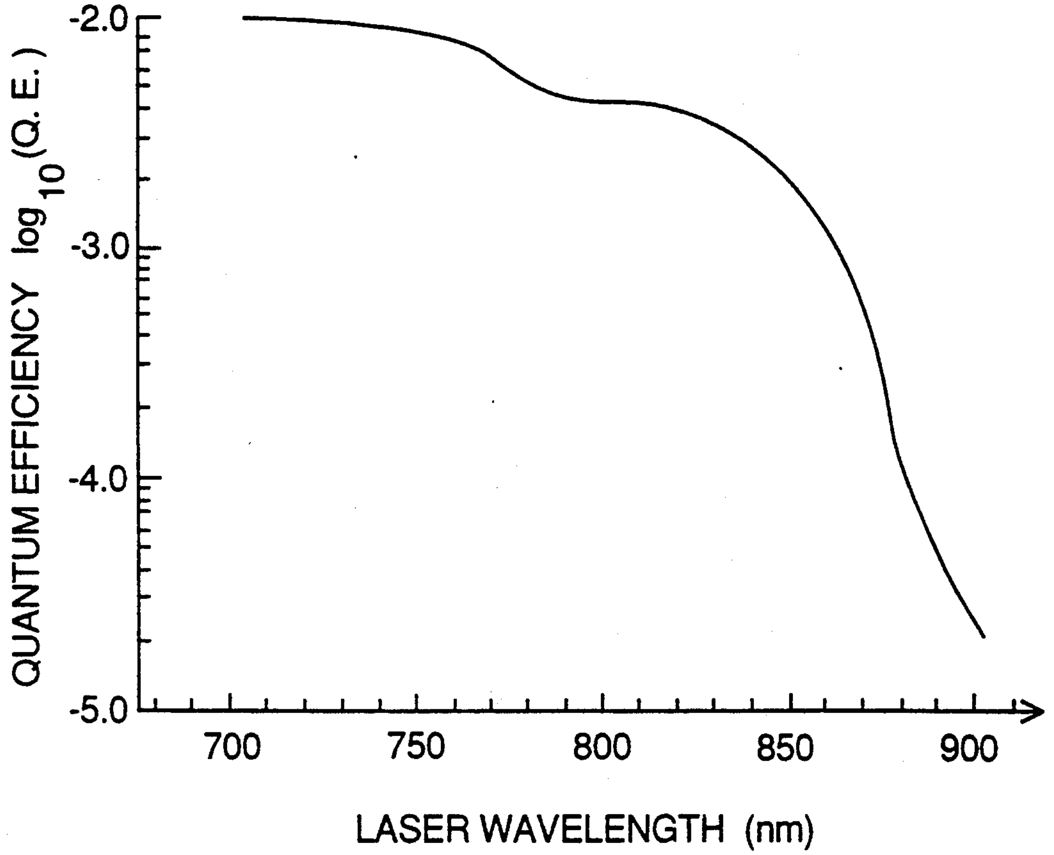
FIG. 10 is a graph representing the quantum efficiency (Q.E.) values measured with respect to the device used in the measurement shown in FIG. 9.

In this example, the semiconductor device of FIG. 1 is manufactured such that the fraction x of the $GaAs_{1-x}P_x$ of the first layer 14 is the same as that of Example 1 but that the thickness t of the gallium arsenide GaAs of the second layer 16 is about 1400 angstroms, which value is about seven times greater than the critical thickness $t_c$. The spin polarization and quantum efficiency with this example are shown in the graphs of FIGS. 9 and 10. As can be seen from the graphs, the polarization and quantum efficiency are about 83% and about $8\times10^{-4}$, respectively, at the laser wavelengths of 855 to 870 nm.

EXAMPLE 3

In the third example, the semiconductor device of FIG. 1 is manufactured such that the fraction x of the $GaAs_{1-x}P_x$ of the first layer 14 is 0.13 ($GaAs_{0.87}P_{0.13}$) and that the thickness t of the gallium arsenide GaAs of the second layer 16 is about 3100 angstroms. Like Examples 1 and 2, spin polarization and quantum efficiency are measured on Example 3. The polarization and quantum efficiency measured are about 67% and about $1\times10^{-3}$, respectively, at the laser wavelengths of 855 to 870 nm. Table II shows the measurements of polarization and quantum efficiency of Examples 1 to 3.

TABLE II

| | Example 1 | Example 2 | Example 3 |
|---|---|---|---|
| Fraction x | 0.17 | 0.17 | 0.13 |
| Thickness t (Å) | 850 | 1400 | 3100 |
| Polarization (%) | 86 | 83 | 67 |
| Quantum Efficiency | $2\times10^{-4}$ | $8\times10^{-4}$ | $1\times10^{-3}$ |

As can be understood from Table II, as the thickness t of the second layer 16 is increased, the quantum efficiency is improved. The reason for this is that the number of electrons excited by the circularly polarized laser beam is increased with the thickness t of the second layer 16. In addition, it is known that, as the thickness t of the second layer 16 is increased, the spin polarization is lowered. One of the reasons for this is that, with the increase of the thickness t, the lattice strain of the second layer crystal 16 is lowered or relaxed, that is, the residual strain of the crystal lattice is reduced, and therefore that the energy splitting between the heavy and light hole bands in the valence band of the second layer 16 is decreased. Another reason is that, with a greater thickness t, a higher ratio of the electrons excited in the second layer crystal 16 are scattered inside the crystal 16 before being emitted off the surface of the crystal 16 and the spin direction of the excited electrons can be reversed due to the scattering. However, this polarization reduction is small, and provides no problem for practical use of the device 10. On the other hand, since the quantum efficiency is increased, the overall performance or quality of the spin-polarized electron beam emitting device 10 is improved.

While, in each of Examples 1 to 3, the semiconductor device 10 is formed such that the energy splitting between the heavy and light hole bands is greater than the energy of thermal noise at room temperature, it is required that the energy splitting be greater than the thermal noise energy at the time of use of the device 10.

Although, in each of Examples 1 to 3, the lattice constant of the second layer 16 is greater than that of the first layer 14, it is possible to form the device 10 such that the lattice constant of the second layer 16 is smaller than that of the first layer 14. In the latter case, the energy level of the light hole band is higher than that of the heavy hole band.

EXAMPLE 4

Figure 11:
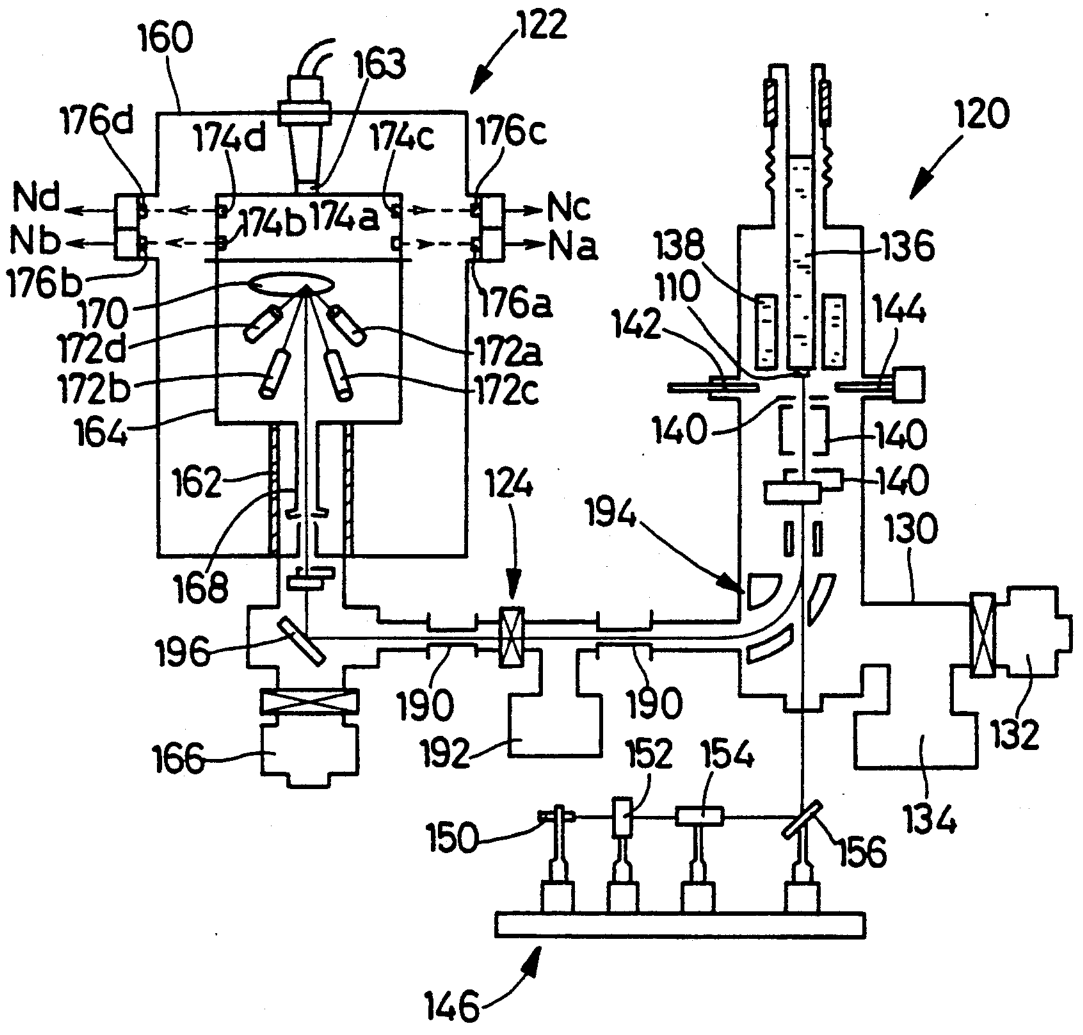
FIG. 11 is a diagrammatic view of a surface magnetism observing apparatus employing the semiconductor device of FIG. 1.

FIG. 11 shows an apparatus for observing the magnetic domain structures on the surface of a magnetic substance or body 196. The apparatus incorporates a semiconductor device 10 of FIG. 1 (i.e., element designated at numeral 110 in FIG. 11). Specifically, the apparatus includes an electron beam generator (electron gun) 120 for emitting a highly spin-polarized electron beam in which a large or major portion of the electrons have their spins aligned in one of the two spin directions. The electron gun 120 includes, as the device 110, a semiconductor device according to the above-indicated Example 1, for example. The apparatus of FIG. 11 further includes a transmission assembly 124 for transmitting the electron beam emitted from the electron gun 120 or device 110 and applying the electron beam to the surface of the magnetic body 196, and a spin analyzer 122 for detecting the spin directions of the electrons reflected, or emitted, from the surface of the magnetic body 196.

The electron gun 120 of FIG. 11 has the same configuration as that of the electron gun 20 of FIG. 4, though the individual elements shown in FIG. 11 are allotted numerals greater by 100 than their corresponding elements shown in FIG. 4. Therefore, the description of those elements are skipped.

The transmission assembly 124 of FIG. 11 has a similar configuration as that of the transmission assembly 24 of FIG. 4, though the individual elements are designated at numerals greater by 100 than their corresponding elements shown in FIG. 4. Thus, the description of those elements are skipped. However, in the present assembly 124, the magnetic body 196 is positioned in place of the Helmholtz coil 96 of FIG. 4. In addition, the present assembly 124 includes a scanning device for moving the magnetic body 196 so that the electron beam scans the surface of the body 196.

The spin analyzer 122 includes a high-voltage tank (Mott's scattering tank) 164 which is disposed in a gas tank 160 filled with Freon and is supported by a high-voltage insulator 162 and to which a 100 kV electric voltage is applied through an anode 163. The analyzer 122 further includes a turbo-molecular pump 166 for sucking gas from the high-voltage tank 164 and thereby placing the tank 164 under a high vacuum of about $10^{-9}$ torr, an accelerator electrode 168 for accelerating the electrons reflected or emitted from the magnetic body 196, a gold (Au) foil 170 which is supported by a disk (not shown) and to which the electrons are incident, four surface barrier detectors 172 (172*a*, 172*b*, 172*c*, 172*d*) for detecting the electrons scattered in the direction of $\theta=120°$ due to collision of the electrons with atomic nuclei of the Au foil 170, four light emitting diodes (LED) 174 (174*a*, 174*b*, 174*c*, 174*d*) each for converting, to a light, an electric signal generated by a corresponding one of the surface barrier detectors 172 and amplified by a pre-amplifier (not shown), and four light detectors 176 (176*a*, 176*b*, 176*c*, 176*d*) each for receiving the light emitted by a corresponding one of the LEDs 174 and converting the light into an electric signal N (Na, Nb, Nc, Nd).

Figure 12:
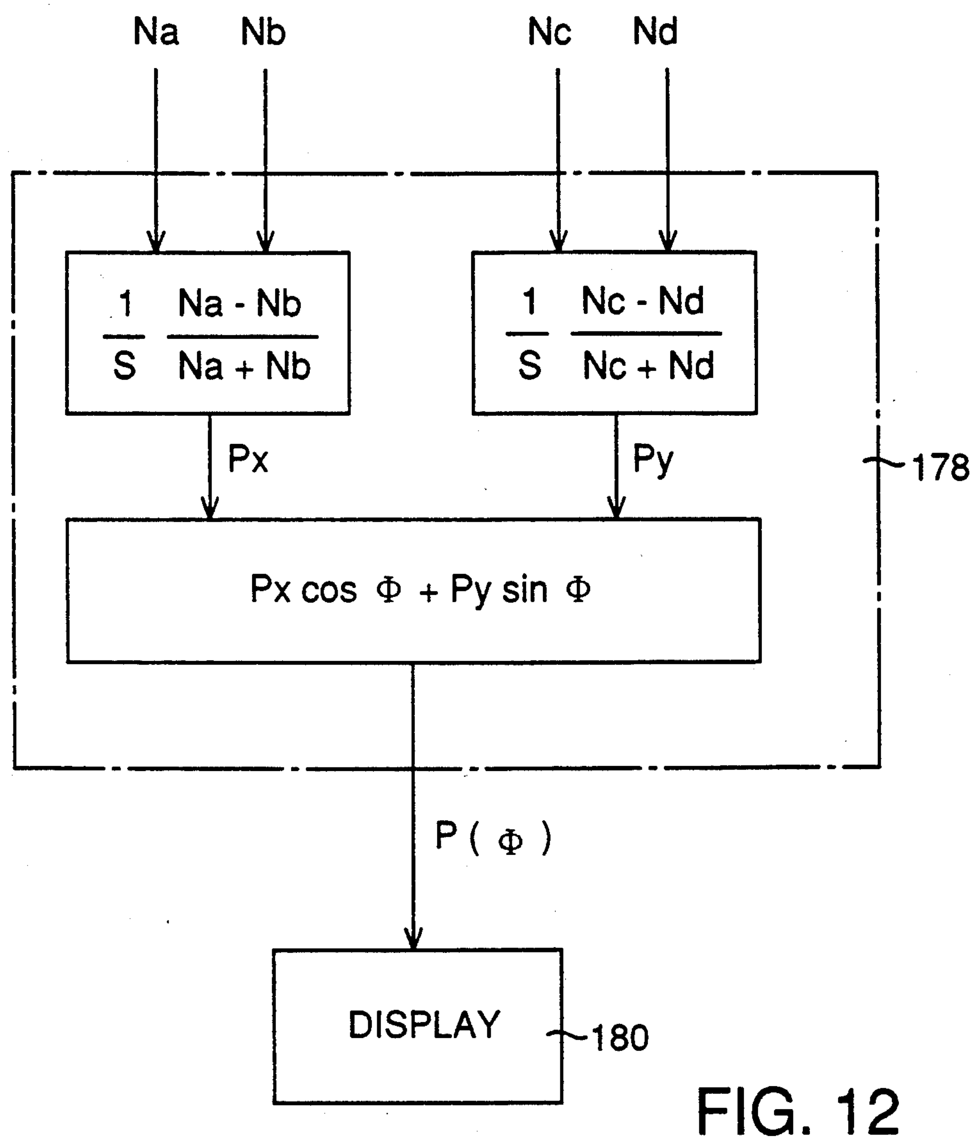
FIG. 12 is a diagrammatic view of an electric circuit of the apparatus of FIG. 11 which processes electric signals.

FIG. 12 shows an electric circuit 178 for processing the electric signals Na, Nb, Nc, Nd, determining the two components, $P_x$ and $P_y$, of a spin polarization vector based on the asymmetry of the scattering magnitudes Na, Nb, Nc, Nd in the symmetric directions, and calculating the polarization vector P (Φ) based on the two components $P_x$, $P_y$. The apparatus of FIG. 11 further includes a display 180 such as a cathode ray tube (CRT) for indicating the image of the magnetism of the surface of the magnetic body 96, based on the polarization vector P (Φ). The symbol "Φ" is indicative of the angle of spin with respect to a stationary coordinate system of the apparatus of FIG. 11. The coordinate system is provided in a plane perpendicular to the direction of flow of the electrons from the magnetic body 196 toward the Au foil 170, that is, plane of the Au foil 170. The angle Φ is defined as being 0° at the intersection between the plane of Au foil 170 and a plane containing the surface barrier detectors 172*a*, 172*b*. In addition, the symbol "S" shown in FIG. 12 is a parameter indicative of the degree of asymmetry due to the spin-orbit interaction, that is, parameter indicative of the difference in probability of the scattering in ±120° directions depending upon the spin directions.

As described previously, the spin polarization of an electron beam emitted from the electron gun 120 or semiconductor device 110 (Example 1), is about 86% at the excitation laser wavelengths of 855 to 870 nm. If this spin-polarized electron beam is applied to the surface of the magnetic body 196 by the transmission assembly 124, electrons are reflected or emitted from the surface of the magnetic body 196. The reflected or emitted electrons are accelerated by accelerator electrodes 168 so as to be incident to the Au foil 170 located in the high-voltage tank 164. The electrons are scattered by the Au foil 170 in an asymmetrical manner depending upon the spin directions thereof, and are detected by the surface barrier detectors 172 (172*a* to 172*d*). Since the transmission assembly 124 displaces the magnetic body 196 so that the electron beam scans the surface of the body 196, the display 180 displays the images of the magnetic domain structures in the surface of the magnetic body 196. Before the observation, the surface of the magnetic body 196 is cleaned by a surface cleaning device (not shown) such as an ion gun.

In the present observation apparatus, a highly spin-polarized electron beam emitted from the semiconductor device 110 is utilized for scanning the surface of the magnetic body 196. Even if the highly spin-polarized electron beam is used at a low current value (i.e., probe current), image signals with a high signal to noise (S/N) ratio are obtained in a short time.

Since the semiconductor device 110 is capable of emitting a highly spin-polarized electron beam in a stable manner, the high S/N image signals are obtained in a stable manner. In addition, the present apparatus is free from the problem that the accuracy of detection of the spin directions of the electrons is lowered because of the fluctuation in spin polarization of a spin-polarized electron beam.

In place of the semiconductor device 110 according to Example 1, it is possible to employ other sorts of spin-polarized electron beam emitting devices.

The present apparatus is capable of observing not only the locations of magnetic domain walls, the areas of magnetic domains and the directions of magnetization of magnetic domains, but also atomic arrangements and the microscopic magnetic features of a magnetic body in the order of atomic dimensions.

While the spin analyzer 122 of the present apparatus is of the Mott type which detects the spin directions of electrons based on Mott scattering, it is possible to use other sorts of spin analyzers such as of the Muller type which operates based on Muller scattering.

Since a spin-polarized electron beam is utilized in the present apparatus, the apparatus is not necessarily required to detect the spin directions of the electrons. More specifically, the spin directions of a spin-polarized electron beam emitted from the electron gun 122 or semiconductor device 110 can be reversed by changing the directions of polarization of the circularly polarized laser beams each of which is injected into the device 110. In the case where the present apparatus includes an electron beam generator which can selectively emit two kinds of spin-polarized electron beams whose spin directions are opposite to each other, the apparatus can detect the magnetism of the surface of the magnetic body 196 by using a common electron beam analyzer, without having to use the spin analyzer 122.

The primary electrons i.e. spin-polarized electron beam applied to the surface of the magnetic body 196, is diffracted under the diffraction condition defined by the crystal structure of the magnetic body 196. Thus, the diffraction pattern or image of the magnetic body 196 is influenced by the magnetism of each portion of the surface to which the electron beam is applied. While the diffraction image is obtained based on the magnitudes of the diffracted electron beams, the magnetism of the surface of the magnetic body 196 is measured by obtaining the diffraction image. In order to obtain the diffraction image, an electron beam analyzer may be disposed at a location which can be specified in advance based on, for example, the crystal structure of the magnetic body 196. In this case, the intensities of electron beams detected by the analyzer at that location may suffice for providing a diffraction image. In the present case, too, an electron beam source which selectively emits two kinds of spin-polarized electrons whose spin directions are opposite to each other, is advantageously used for detecting the magnetism of the surface of the magnetic body 196 by using the electron beam analyzer. The present apparatus is capable of observing the magnetism of an antiferromagnetic body, based on a diffraction image thereof, though the magnetism of such a body cannot be observed by using a common, non-polarized electron beam.

While, in the illustrated embodiment and examples, the first layer 14 is formed of the gallium arsenide phosphide $GaAs_{1-x}P_x$, it is possible to form the first layer 14 by using other sorts of semiconductor materials, such as gallium aluminum arsenide $Ga_{1-x}Al_xAs$, gallium indium arsenide phosphide $Ga_xIn_{1-x}As_{1-y}P_y$, indium gallium aluminum phosphide $In_{1-x-y}Ga_xAl_yP$, or gallium indium phosphide $Ga_{1-x}In_xP_y$.

It is to be understood that the present invention may be embodied with various changes, modifications and improvements that may occur to those skilled in the art without departing from the scope and spirit of the invention defined by the appended claims.

What is claimed is:

1. A semiconductor device for emitting, upon receiving a light energy, a highly spin-polarized electron beam, comprising:

a first compound semiconductor layer formed of gallium arsenide phosphide, $GaAs_{1-x}P_x$, and having a first lattice constant;

a second compound semiconductor layer grown with gallium arsenide, GaAs, on said first compound semiconductor layer, and having a second lattice constant different from said first lattice constant and a thickness t smaller than the thickness of said first compound semiconductor layer, said second compound semiconductor layer emitting said highly spin-polarized electron beam upon receiving said light energy; and a fraction, x, of said gallium arsenide phosphide $GaAs_{1-x}P_x$ and said thickness, t, of said second compound semiconductor layer defining a magnitude of mismatch between said first and second lattice constants, such that said magnitude of mismatch provides a residual strain, $\epsilon_R$, of not less than $2.0\times10^{-3}$ in said second semiconductor layer.

2. The semiconductor device as set forth in claim 1, wherein said fraction x of said gallium arsenide phosphide $GaAs_{1-x}P_x$ and said thickness t, in angstrom unit, of said second compound semiconductor layer satisfy the following two expressions:

$$t \leqq -18000x+8400$$

$$t \leqq -7000x+5100.$$

3. The semiconductor device as set forth in claim 2, wherein said fraction x and said thickness t define said magnitude of mismatch between said first and second lattice constants such that said magnitude of mismatch provides said residual strain $\epsilon_R$ of not less than $2.6\times10^{-3}$ in said second compound semiconductor layer, said fraction x and said thickness t in angstrom unit satisfying the following two expressions:

$$t \leqq -12000x+6400$$

$$t \leqq -6000x+4600.$$

4. The semiconductor device as set forth in claim 3, wherein said fraction x and said thickness t define said magnitude of mismatch between said first and second lattice constants such that said magnitude of mismatch provides said residual strain $\epsilon_R$ of not less than $3.5\times10^{-3}$ in said second compound semiconductor layer, said fraction x and said thickness t in angstrom unit satisfying the following two expressions:

$$t \leqq -10000x+5600$$

$$t \leqq -6000x+4400.$$

5. The semiconductor device as set forth in claim 4, wherein said fraction x and said thickness t define said magnitude of mismatch between said first and second lattice constants such that said magnitude of mismatch provides said residual strain $\epsilon_R$ of not less than $4.6\times10^{-3}$ in said second compound semiconductor layer, said fraction x and said thickness t in angstrom unit satisfying the following expression:

$$t \leqq -4000x+3400.$$

6. The semiconductor device as set forth in claim 5, wherein said fraction x and said thickness t define said magnitude of mismatch between said first and second lattice constants such that said magnitude of mismatch provides said residual strain $\epsilon_R$ of not less than $5.4\times10^{-3}$ in said second compound semiconductor layer, said fraction x and said thickness t in angstrom unit satisfying the following two expressions:

$$t \leqq -3000x+2800$$

$$t \leqq 22000x-2200.$$

7. The semiconductor device as set forth in claim 1, further comprising a semiconductor substrate on which said first and second compound semiconductor layers are formed one on another.

8. The semiconductor device as set forth in claim 7, wherein said semiconductor substrate is formed of gallium arsenide (GaAs) crystal.

9. The semiconductor device as set forth in claim 1, wherein said fraction x of said gallium arsenide phosphide $GaAs_{1-x}P_x$ and said thickness t of said second compound semiconductor layer define said magnitude of mismatch between said first and second lattice constants, such that said magnitude of mismatch provides an energy splitting between a heavy hole band and a light hole band in said second layer so that said energy splitting is greater than a thermal noise energy in said second layer.

10. The semiconductor device as set forth in claim 1, consisting essentially of said first and second compound semiconductor layer.

* * * * *

UNITED STATES PATENT AND TRADEMARK OFFICE

CERTIFICATE OF CORRECTION

PATENT NO. : 5,315,127

DATED : May 24, 1994

INVENTOR(S) : Tsutomu NAKANISHI, et al.

It is certified that error appears in the above-indentified patent and that said Letters Patent is hereby corrected as shown below:

On the title page, Item [75], the 1st inventor's name should read as follows:

--Tsutomu Nakanishi--

Signed and Sealed this

Sixth Day of September, 1994

Attest:

BRUCE LEHMAN

Attesting Officer

Commissioner of Patents and Trademarks